United States Patent
Wang

(10) Patent No.: US 10,374,024 B2
(45) Date of Patent: Aug. 6, 2019

(54) FLEXIBLE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xing Wang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 15/580,449

(22) PCT Filed: Nov. 24, 2017

(86) PCT No.: PCT/CN2017/112889
§ 371 (c)(1),
(2) Date: Dec. 7, 2017

(87) PCT Pub. No.: WO2019/061780
PCT Pub. Date: Apr. 4, 2019

(65) Prior Publication Data
US 2019/0165072 A1 May 30, 2019

(30) Foreign Application Priority Data
Sep. 27, 2017 (CN) .......................... 2017 1 0891601

(51) Int. Cl.
*H01L 27/12* (2006.01)
*H01L 27/32* (2006.01)
(Continued)

(52) U.S. Cl.
CPC ...... *H01L 27/3265* (2013.01); *H01L 27/3262* (2013.01); *H01L 51/0097* (2013.01);
(Continued)

(58) Field of Classification Search
CPC .......... H01L 29/78645; H01L 27/3265; H01L 27/1255; H01L 27/3288; H01L 27/0248;
(Continued)

(56) References Cited

U.S. PATENT DOCUMENTS

2007/0194317 A1 8/2007 Lim et al.
2014/0353605 A1* 12/2014 Kim ...................... H01L 27/124
257/40
(Continued)

FOREIGN PATENT DOCUMENTS

| CN | 101025489 A | 8/2007 |
|---|---|---|
| CN | 101630078 A | 1/2010 |

(Continued)

*Primary Examiner* — Charles D Garber
*Assistant Examiner* — Alia Sabur
(74) *Attorney, Agent, or Firm* — Hauptman Ham, LLP

(57) ABSTRACT

A flexible display panel includes a display region and a non-display region. Capacitors are added to an empty region of the non-display region. The capacitors have ability to buffer a release of electrostatic charges, thereby reducing damage to inner devices and metal wiring film layers caused by the electrostatic charges and protecting the metal wiring film layers from being damaged and destroyed by the electrostatic charges during manufacturing active thin-film transistors of the flexible display panel.

12 Claims, 6 Drawing Sheets

(51) Int. Cl.
*H01L 51/00* (2006.01)
*H01L 29/786* (2006.01)

(52) U.S. Cl.
CPC ...... *H01L 27/1255* (2013.01); *H01L 27/1288* (2013.01); *H01L 29/78645* (2013.01); *H01L 2227/323* (2013.01); *H01L 2251/5338* (2013.01)

(58) Field of Classification Search
CPC ............ H01L 27/0296; H01L 27/0288; G02F 1/136204
See application file for complete search history.

(56) References Cited

U.S. PATENT DOCUMENTS

2016/0358938 A1* 12/2016 Lee ................. H01L 27/124
2018/0019294 A1    1/2018 Zhai
2018/0166472 A1    6/2018 Liang et al.

FOREIGN PATENT DOCUMENTS

CN    105929615 A    9/2016
CN    107123666 A    9/2017

* cited by examiner

FLEXIBLE DISPLAY PANEL AND MANUFACTURING METHOD THEREOF

CROSS REFERENCE TO RELATED APPLICATION

This application claims the priority of Chinese Patent Application No. 201710891601.X on Sep. 27, 2017 in the Chinese Patent and Trademark Office. Further, this application is the National Phase application of International Application No. PCT/CN2017/112889 filed on Nov. 24, 2017, which is incorporated herein by reference in its entirety.

BACKGROUND

1. Field of the Disclosure

The present disclosure relates to display device technologies, and more particularly to a flexible display panel.

2. Description of Related Art

As a major base and carrier of information transfer and exchange, display devices, such as liquid crystal displays (LCDs) and organic light emitting diode (OLED) displays, are gaining more attention and are widely used in people's life, work, etc. In recent years, with increasing demand for portable display devices, flexible display technology has become one of the most competitive display technologies and has been favored by both industries and consumers. One great advantage of the flexible display technology is its foldability. This property can increase display area without increasing device size, and makes the device very portable. Flexible TFT-LCDs and flexible OLED displays have gradually developed into the most promising high-tech industries. Various types of flexible display devices, such as TV screens, cell phone screens, wearable devices, large commercial display screens, and computer screens, are available from various research institutes and enterprises.

OLED display technology provides benefits like self-illumination, high brightness, wide viewing angles, high contrast, flexibility, and low power consumption, and thus receives more and more attention. As a new generation of displays, OLED displays have gradually replaced the traditional LCDs and are widely used in mobile phone screens, computer monitors, and full-color TVs. Particularly, OLED flexible display technology uses a very thin organic light-emitting layer and a flexible substrate. The organic material will emit light rays when electric current flows through it.

OLED display devices can be categorized into two major types according to the driving method, which are passive matrix OLED (PMOLED) devices and active matrix OLED (AMOLED) devices, i.e., direct addressing and thin film transistor (TFT) matrix addressing.

The AMOLED includes pixels arranged in arrays and belongs to the active display type, which has high lighting efficiency and excellent performance. However, during manufacturing, accumulated electrostatic charge can easily damage second gate electrodes in a fan-out area of a non-display region, resulting in erosion or damage of signal transmission lines, causing a display of a flexible display panel to be abnormal.

As to the above problems, it is required to develop a new flexible display panel and its manufacturing method to eliminate electrostatic charge accumulated in display panel manufacturing processes, avoid erosion of film layers, and assure normal display.

SUMMARY

The present disclosure provides a flexible display panel capable of efficiently improving a yield rate of the flexible display panels, eliminating erosion of film layers caused by electrostatic charges, and protecting the screen displayed by flexible driving panels from being damaged.

To solve the above problems, the present disclosure provides a flexible display panel comprising a display region and a non-display region, wherein thin-film transistors are disposed in the display region, the thin-film transistors have a first gate electrode and a second gate electrode, the non-display region includes metal wiring regions and an empty region located between the metal wiring regions, a first metal plate and a second metal plate opposite to each other are disposed in the empty region, the first metal plate and the first gate electrode belong to a same layer, the second metal plate and the second gate electrode belong to a same layer, a capacitor is formed between the first metal plate and the second metal plate, the first metal plate and the second metal plate have a same shape, the first gate electrode and the first metal plate have a same thickness, the second gate electrode and the second metal plate have a same thickness.

The present disclosure further provides a flexible display panel comprising a display region and a non-display region, wherein thin-film transistors are disposed in the display region, the thin-film transistors have a first gate electrode and a second gate electrode, the non-display region includes metal wiring regions and an empty region located between the metal wiring regions, a first metal plate and a second metal plate opposite to each other are disposed in the empty region, the first metal plate and the first gate electrode belong to a same layer, the second metal plate and the second gate electrode belong to a same layer, a capacitor is formed between the first metal plate and the second metal plate.

In one embodiment, the first metal plate and the second metal plate have a same shape.

In one embodiment, the first metal plate and the second metal plate are shaped as a circle or a square.

In one embodiment, the first gate electrode and the first metal plate have a same thickness and the second gate electrode and the second metal plate have a same thickness.

In one embodiment, the non-display region includes a flexible substrate, a buffer layer disposed on the flexible substrate, an active layer disposed on the buffer layer, and a first insulating layer covering the active layer and the buffer layer, wherein the first gate electrode is disposed on the first insulating layer, the first insulating layer extends to the non-display region, and the first metal plate is disposed on the first insulating layer of the non-display region.

In one embodiment, the flexible display panel further includes a second insulating layer covering the first gate electrode, the first metal plate, and the first insulating layer, wherein the second gate electrode is disposed on the second insulating layer in the display region, and the second metal plate is disposed on the second insulating layer in the empty region of the non-display region.

In one embodiment, the flexible display device further includes a third insulating layer covering the second gate electrode, the second metal plate, and the second insulating layer.

In one embodiment, the flexible display device further includes a source electrode and a drain electrode, wherein the source electrode and the drain electrode penetrate the first insulating layer, the second insulating layer, and the third insulating layer, and connect to the active layer.

In the present disclosure, a series of capacitors are added to the empty region of the non-display region. The capacitors have an ability to buffer a release of electrostatic charges, thereby reducing the damage to inner devices and metal wiring film layers caused by the electrostatic charges and protecting the metal wiring film layers from being damaged and destroyed by the electrostatic charges during the manufacture of active thin-film transistors of the flexible display panel. This can efficiently improve a yield rate of the flexible display panels, eliminate erosion of the film layers caused by the electrostatic charges, and protect the screen displayed by flexible driving panels from being damaged. The first metal plate and the first gate electrode are formed using a same process as well as the second metal plate and the second gate electrode. It does not require additional processes, thereby achieving cost savings.

DETAILED DESCRIPTION OF PREFERRED EMBODIMENTS

Embodiments of a flexible display panel provided in the present disclosure will be described in detail with reference to the appended figures.

Figure 1:
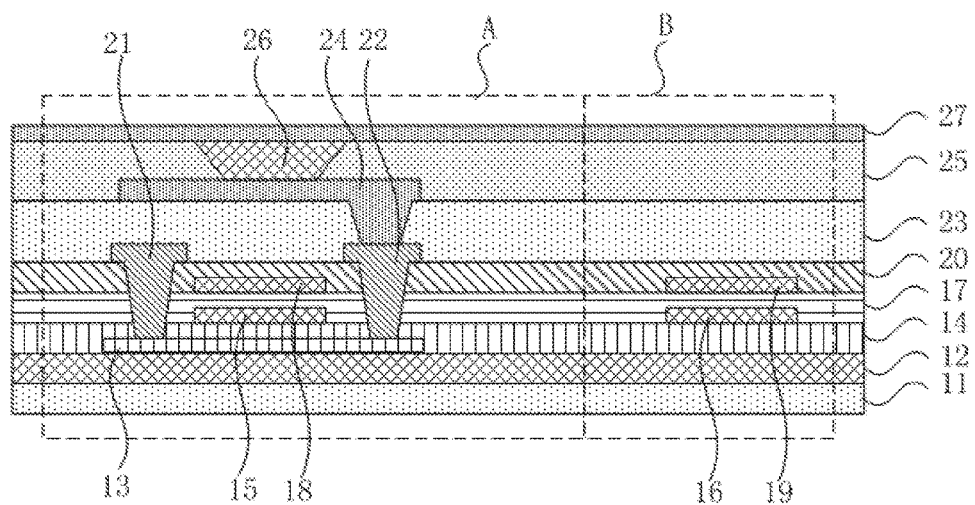
FIG. 1 is a schematic structural diagram showing a flexible display panel in accordance with the present disclosure.

FIG. 1 is a schematic structural diagram showing a flexible display panel in accordance with the present disclosure. Referring to FIG. 1, the flexible display panel of the present disclosure includes a display region A and a non-display region B. In FIG. 1, the display region A and the non-display region B are denoted schematically with dashed boxes. The flexible display panel of the present disclosure is an organic light emitting diode (OLED) display panel, that is, an OLED flexible display panel. The display region A has organic light emitting diodes. The display region A is configured to display images. The non-display region B is a region outside the display region A, for example, metal wiring regions. In the non-display region B, the metal wiring regions are called a fan-out region. An empty region is located between the metal wiring regions.

A structure of the flexible display panel is described below.

The display region A includes a flexible substrate 11. The flexible substrate 11 is formed by coating a flexible substrate thin film layer on a glass substrate. A material of the flexible substrate thin film layer can be polyimide (PI). Preferably, the thickness of the polyimide can be 10-20 μm.

A buffer layer 12 is disposed on the flexible substrate 11. An active layer 13 is disposed on the buffer layer 12. A first insulating layer 14 covers the buffer layer 12 and the active layer 13. The first insulating layer 14 extends to the non-display region B. In the display region A, a first gate electrode 15 is disposed on the first insulating layer 14. The first gate electrode 15 is disposed corresponding to the active layer 13. In the non-display region B, a first metal plate 16 is disposed on the first insulating layer 14 of the non-display region B, and the first metal plate 16 is located in the empty region of the non-display region B. The first gate electrode 15 and the first metal plate 16 belong to a same layer. Preferably, the thickness of the buffer layer 12 is 200-300 nm, the thickness of the active layer 13 is 40-50 nm, the thickness of the first insulating layer 14 is 50-200 nm, and the thickness of the first gate electrode 15 or the first metal plate 16 is 150-250 nm.

A second insulating layer 17 covers the first gate electrode 15, the first metal plate 16, and the first insulating layer 14. A second gate electrode 18 and a second metal plate 19 are disposed on the second insulating layer 17. The second gate electrode 18 is disposed corresponding to the first gate electrode 15. The second metal plate 19 is disposed corresponding to the first metal plate 16. The second gate electrode 18 and the second metal plate 19 belong to a same layer. Preferably, the thickness of the second insulating layer 17 is 50-200 nm, and the thickness of the second gate electrode 18 or the second metal plate 19 is 150-250 nm.

The second metal plate 19 is disposed corresponding to the first metal plate 16. The second metal plate 19, the first metal plate 16, and the second insulating layer 17 between the second metal plate 19 and the first metal plate 16 form a capacitor. The capacitor has an ability to buffer a release of electrostatic charges, thereby reducing damage to inner devices and metal wiring film layers caused by the electrostatic charges. The first metal plate 16 and the second metal plate 19 have a same shape, for example, both of them are shaped as a circle or a square.

A third insulating layer 20 covers the second gate electrode 18, the second metal plate 19, and the second insulating layer 17. A source electrode 21 and a drain electrode 22 penetrate the first insulating layer 14, the second insulating layer 17, and the third insulating layer 20, and connect to the active layer 13. Preferably, the thickness of the third insulating layer 20 is 500-700 nm, and the thickness of the source electrode 21 or the drain electrode 22 is 400-600 nm.

The active layer 13, the first gate electrode 15, the second gate electrode 18, the source electrode 21, and the drain electrode 22 form a thin-film transistor.

A flattened layer 23 covers the third insulating layer 20, the source electrode 21, and the drain electrode 22. A through hole (not labeled in the drawings) is formed in the flattened layer 23 at a position of the drain electrode 22. An anode layer 24 of an organic light emitting diode connects to the drain electrode 22 via the through hole. A pixel definition layer 25 is disposed on the anode layer 24. An organic light emitting layer 26 is disposed on the anode layer 24. The pixel definition layer 25 surrounds the organic light emitting layer 26. A cathode layer 27 is disposed on the pixel definition layer 25 and the organic light emitting layer 26. Preferably, the thickness of the flattened layer 23 is 1.5-3 μm, the thickness of the anode layer 24 is 100-250 nm, the thickness of the pixel definition layer 25 is 1.5-3 μm, and the thickness of the cathode layer 27 is 10-200 nm.

Materials of the first gate electrode 15, the second gate electrode 18, the first metal plate 16, and the second metal plate 19 can be molybdenum. Materials of the source electrode 21 and the drain electrode 22 can be titanium and aluminum. The first insulating layer 14, the second insulating layer 17, and the third insulating layer 30 are inorganic layers. A material of the inorganic layer can be one of SiOx and SiNx, or their combinations. A material of the active layer 13 is low temperature poly-silicon (LTPS). Materials of the flattened layer 23 and the pixel definition layer 25 can be polyimide. A material of the anode layer 24 can be indium tin oxide film (ITO) and silver. A material of the cathode layer 27 can be a material with high transmittance, for example, a thin magnesium or silver layer.

Figure 2:
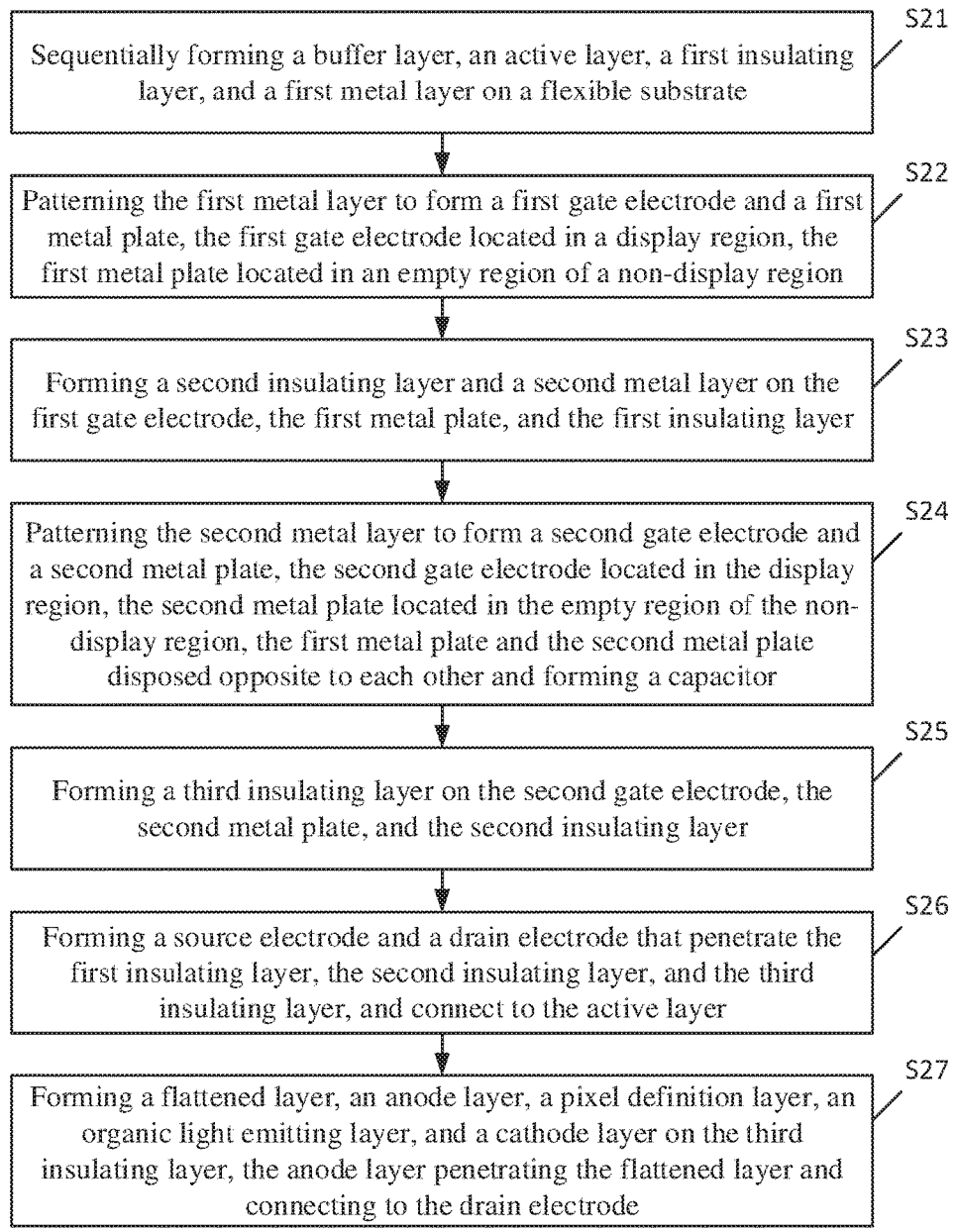
FIG. 2 is a flow chart of a method for manufacturing a flexible display panel in accordance with the present disclosure.

FIG. 2 is a flow chart of a method for manufacturing a flexible display panel in accordance with the present disclosure. FIGS. 3A to 3H are schematic diagrams illustrating steps of manufacturing the flexible display panel in accordance with the present disclosure.

Figure 3A:
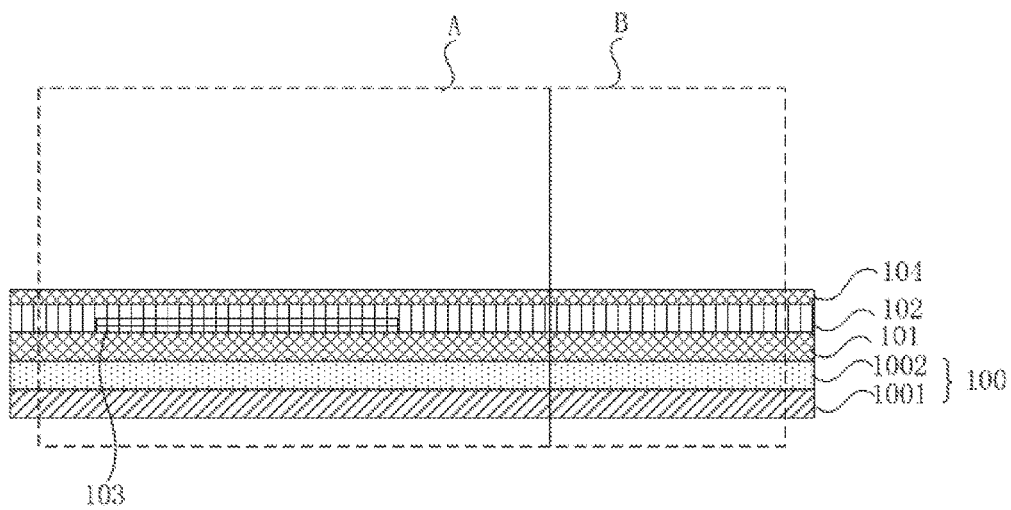
FIGS. 3A to 3H are schematic diagrams illustrating steps of manufacturing the flexible display panel in accordance with the present disclosure.

Referring to FIG. 3A and Step S21, a buffer layer 101, an active layer 103, a first insulating layer 102, and a first metal layer 104 are sequentially formed on a flexible substrate 100. The flexible substrate 100 is formed by coating a flexible substrate thin film layer 1002 on a glass substrate 1001. A material of the flexible substrate thin film layer 111 can be polyimide (PI). Preferably, the thickness of the polyimide can be 10-20 µm. Preferably, the thickness of the buffer layer 101 is 200-300 nm, the thickness of the active layer 103 is 40-50 nm, the thickness of the first insulating layer 102 is 50-200 nm, and the thickness of the first metal layer 104 is 150-250 nm.

Figure 3B:
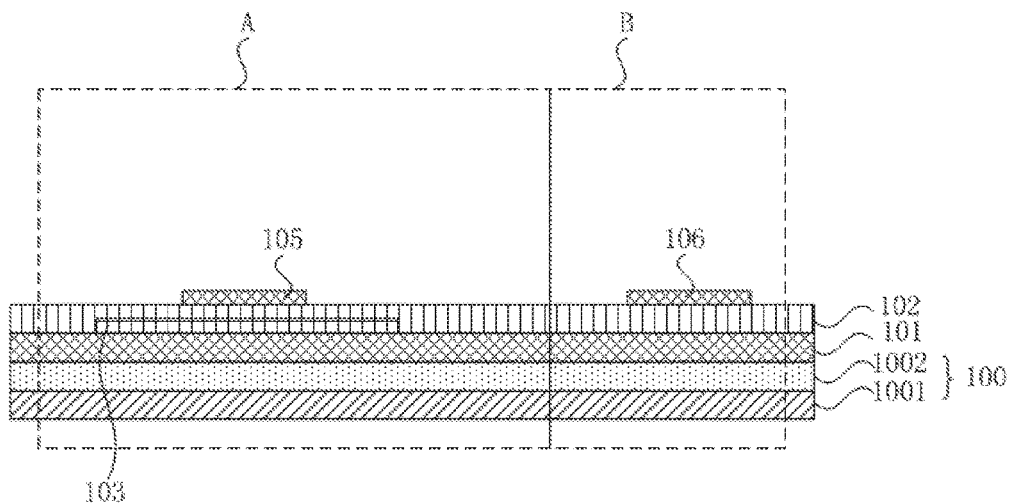

Referring to FIG. 3B and Step S22, the first metal layer 104 is patterned to form a first gate electrode 105 and a first metal plate 106. The first gate electrode 105 is located in a display region A. The first metal plate 106 is located in an empty region of a non-display region B. In this step, the first gate electrode 105 and the first metal plate 106 are formed using a same metal layer and adopting a same process. The first gate electrode 105 and the first metal plate 106 belong to a same layer.

Figure 3C:
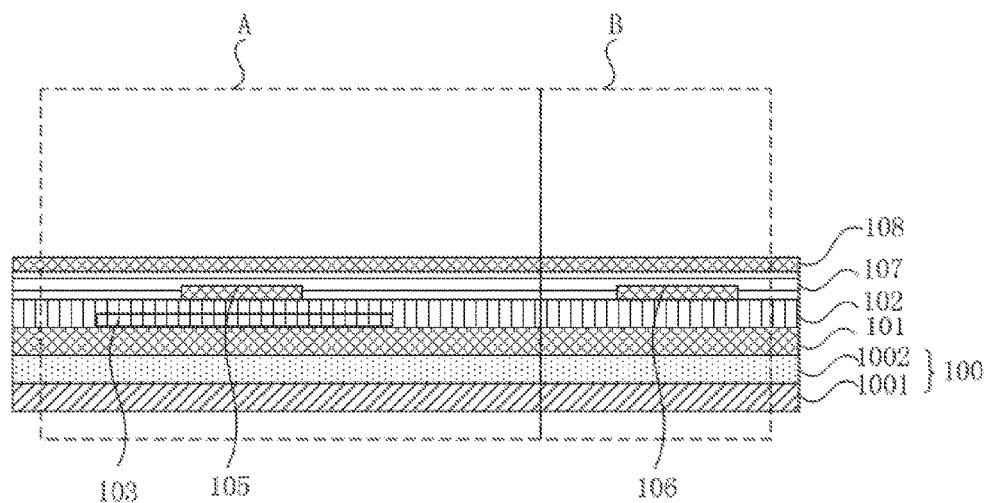

Referring to FIG. 3C and Step S23, a second insulating layer 107, and a second metal layer 108 are formed on the first gate electrode 105, the first metal plate 106, and the first insulating layer 102. The second insulating layer 107 and the second metal layer 108 can be formed by common sputter deposition. Preferably, the thickness of the second insulating layer 107 is 50-200 nm, and the thickness of the second metal layer 108 is 150-250 nm.

Figure 3D:
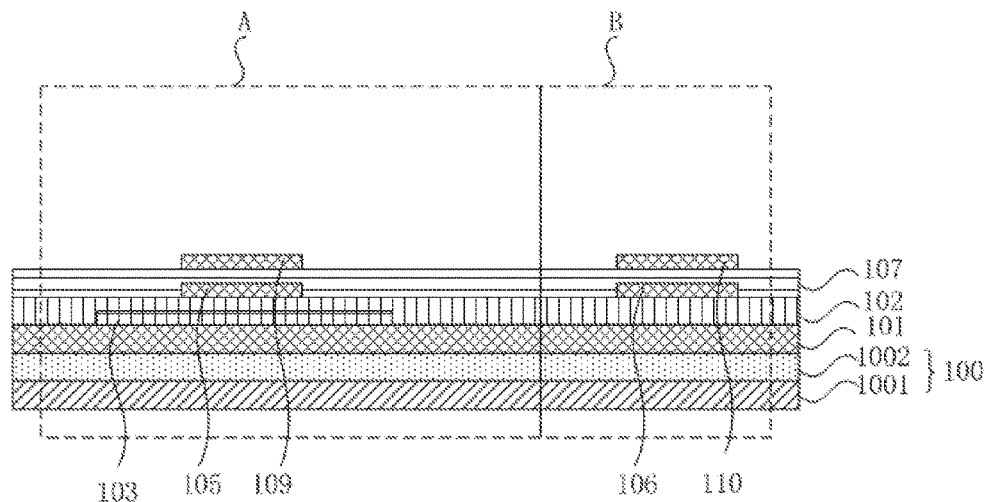

Referring to FIG. 3D and Step S24, the second metal layer 108 is patterned to form a second gate electrode 109 and a second metal plate 110. The second gate electrode 109 is located in the display region A. The second metal plate 110 is located in the empty region of the non-display region B. In this step, the second gate electrode 109 and the second metal plate 110 are formed using a same metal layer and adopting a same process. The second gate electrode 109 and the second metal plate 110 belong to a same layer.

The first metal plate 106 and the second metal plate 110 are disposed opposite to each other. The second metal plate 110, the first metal plate 106, and the second insulating layer 107 between the second metal plate 110 and the first metal plate 106 form a capacitor. The capacitor has ability to buffer a release of electrostatic charges, thereby reducing damage to inner devices and metal wiring film layers caused by the electrostatic charges. The first metal plate 106 and the second metal plate 110 have a same shape, for example, both of them are shaped as a circle or a square.

Figure 3E:
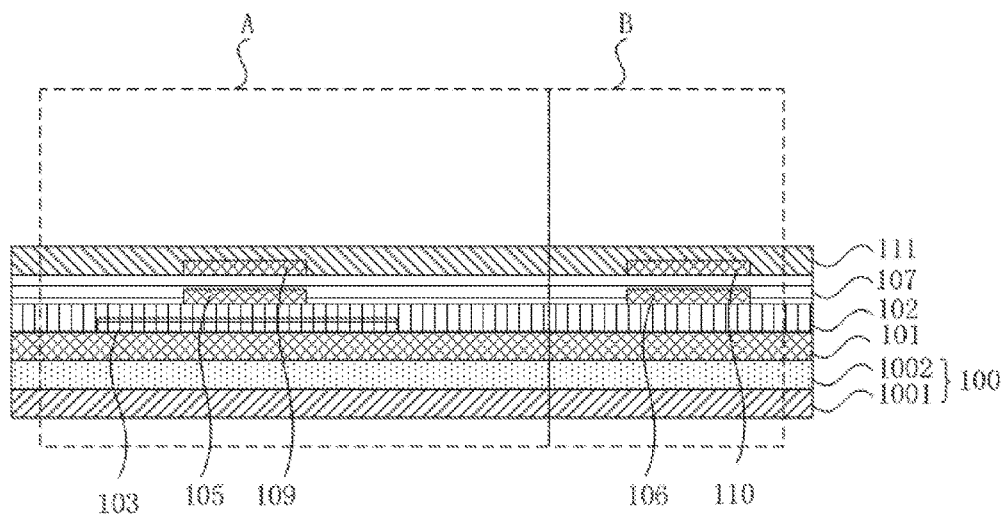

Referring to FIG. 3E and Step S25, a third insulating layer 111 is formed on the second gate electrode 109, the second metal plate 110, and the second insulating layer 107. A common deposition approach in this field can be adopted to form the third insulation layer 111.

Figure 3F:
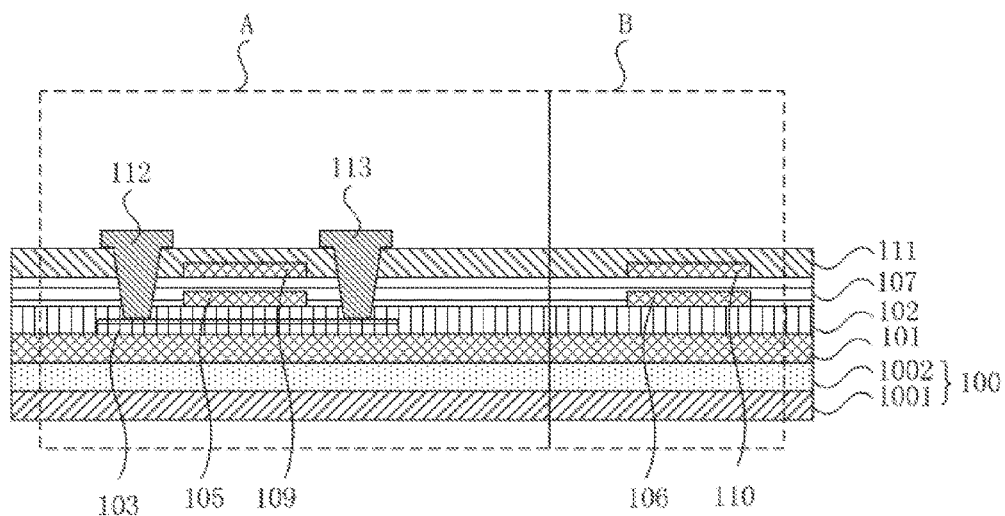

Referring to FIG. 3F and Step S26, a source electrode 112 and a drain electrode 113 are formed. The source electrode 112 and the drain electrode 113 penetrate the first insulating layer 102, the second insulating layer 107, and the third insulating layer 111, and connect to the active layer 103.

Figure 3G:
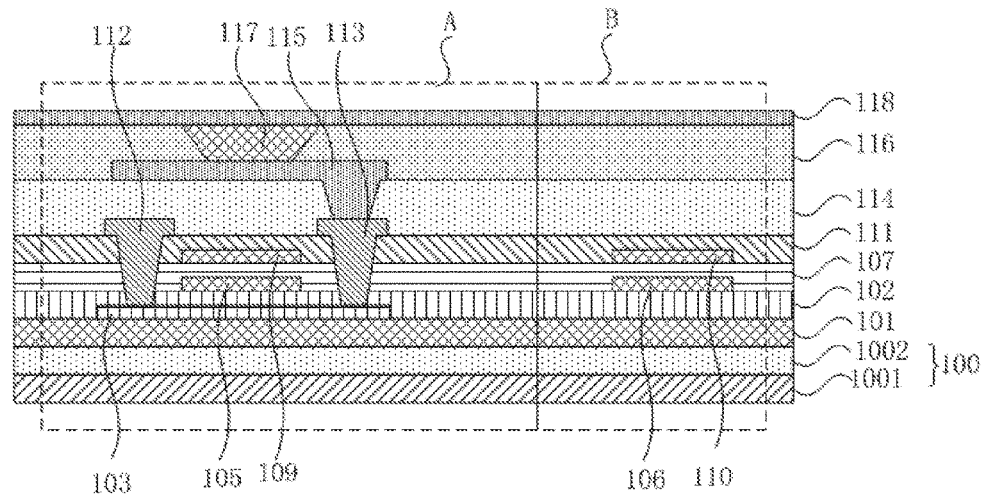

Referring to FIG. 3G and Step S27, a flattened layer 114, an anode layer 115, a pixel definition layer 116, an organic light emitting layer 117, and a cathode layer 118 are formed on the third insulating layer 111. The anode layer 115 penetrates the flattened layer 114 and connects to the drain electrode 113. The flattened layer 114, the anode layer 115, the pixel definition layer 116, the organic light emitting diode 117, and the cathode layer 118 can be manufactured using a common approach in this field, which is not detailed herein.

Figure 3H:
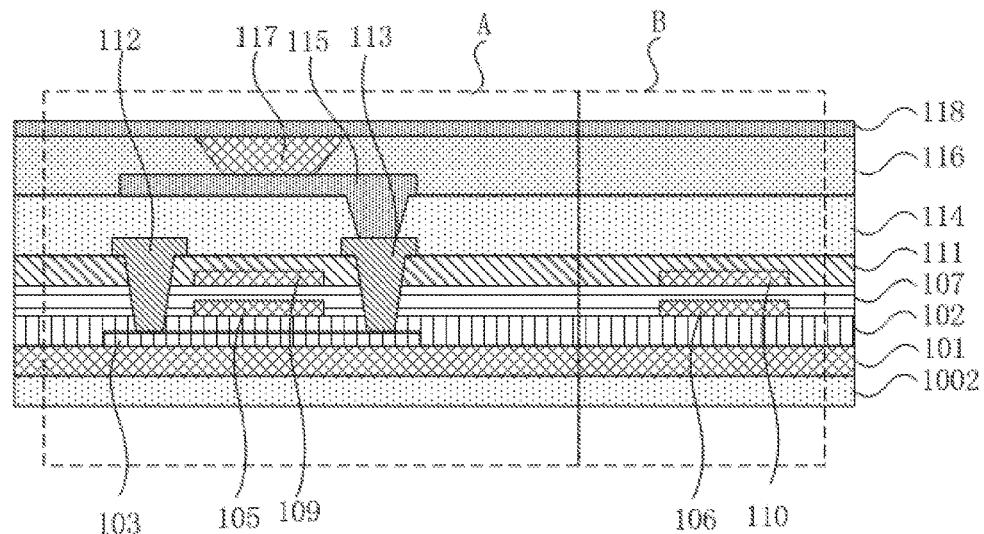

Referring to FIG. 3H, a flexible display panel is formed after the glass substrate 1001 is removed. The glass substrate 1001 can be removed using a peeling technique.

The above descriptions are preferred embodiments of the present disclosure. It should be noted that various modifications and alterations can be made by persons skilled in this art without departing from the principles of the present disclosure, and that all modifications and alterations are within the scope of the present disclosure.

The invention claimed is:

1. A flexible display panel comprising:
   a display region and a non-display region, wherein thin-film transistors are disposed in the display region, the thin-film transistors have a first gate electrode and a second gate electrode, the non-display region comprises metal wiring regions and an empty region located between the metal wiring regions;
   a first metal plate and a second metal plate opposite to each other, disposed in the empty region, wherein the first metal plate and the first gate electrode belong to a same layer, the second metal plate and the second gate electrode belong to a same layer; and
   a capacitor formed between the first metal plate and the second metal plate, wherein the first metal plate and the second metal plate have a same shape, the first gate electrode and the first metal plate have a same thickness, the second gate electrode and the second metal plate have a same thickness.

2. A flexible display panel comprising:
   a display region and a non-display region, wherein thin-film transistors are disposed in the display region, the thin-film transistors have a first gate electrode and a second gate electrode, the non-display region comprises metal wiring regions and an empty region located between the metal wiring regions;
   a first metal plate and a second metal plate opposite to each other, disposed in the empty region, wherein the first metal plate and the first gate electrode belong to a same layer, the second metal plate and the second gate electrode belong to a same layer, and
   a capacitor formed between the first metal plate and the second metal plate.

3. The flexible display panel according to claim 2, wherein the first metal plate and the second metal plate have a same shape.

4. The flexible display panel according to claim 2, wherein the first metal plate and the second metal plate are shaped as a circle or a square.

5. The flexible display panel according to claim 2, wherein the first gate electrode and the first metal plate have a same thickness and the second gate electrode and the second metal plate have a same thickness.

6. The flexible display panel according to claim 2, wherein the non-display region comprises a flexible substrate, a buffer layer disposed on the flexible substrate, an active layer disposed on the buffer layer, a first insulating layer covering the active layer and the buffer layer, wherein the first gate electrode is disposed on the first insulating layer, the first insulating layer extends to the non-display region, and the first metal plate is disposed on the first insulating layer of the non-display region.

7. The flexible display panel according to claim 6, further comprising a second insulating layer covering the first gate electrode, the first metal plate, and the first insulating layer, wherein the second gate electrode is disposed on the second insulating layer in the display region, and the second metal plate is disposed on the second insulating layer in the empty region of the non-display region.

8. The flexible display panel according to claim 7, further comprising a third insulating layer covering the second gate electrode, the second metal plate, and the second insulating layer.

9. The flexible display panel according to claim 8, further comprising a source electrode and a drain electrode, wherein the source electrode and the drain electrode penetrate the first insulating layer, the second insulating layer, and the third insulating layer, and connect to the active layer.

10. A method for manufacturing a flexible display panel, comprising:

sequentially forming a buffer layer, an active layer, a first insulating layer, and a first metal layer on a flexible substrate;

patterning the first metal layer to form a first gate electrode and a first metal plate, the first gate electrode located in a display region of the flexible display panel, the first metal plate located in an empty region of a non-display region of the flexible display panel;

forming a second insulating layer and a second metal layer on the first gate electrode, the first metal plate, and the first insulating layer, patterning the second metal layer to form a second gate electrode and a second metal plate, the second gate electrode located in the display region of the flexible display panel, the second metal plate located in the empty region of the non-display region of the flexible display panel, the first metal plate and the second metal plate disposed opposite to each other and forming a capacitor;

forming a third insulating layer on the second gate electrode, the second metal plate, and the second insulating layer;

forming a source electrode and a drain electrode that penetrate the first insulating layer, the second insulating layer, and the third insulating layer, and connect to the active layer and forming a flattened layer, an anode layer, a pixel definition layer, an organic light emitting layer, and a cathode layer on the third insulating layer, the anode layer penetrating the flattened layer and connecting to the drain electrode.

11. The method according to claim 10, wherein the first gate electrode and the first metal plate belong to a same layer.

12. The method according to claim 10, wherein the second gate electrode and the second metal plate belong to a same layer.

* * * * *